(12) United States Patent
Hoshino et al.

(10) Patent No.: US 6,395,627 B1
(45) Date of Patent: May 28, 2002

(54) SEMICONDUCTOR DEVICE A BURRIED WIRING STRUCTURE AND PROCESS FOR FABRICATING THE SAME

(75) Inventors: Kazuhiro Hoshino; Takeshi Nogami, both of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/691,187

(22) Filed: Oct. 19, 2000

(30) Foreign Application Priority Data

Oct. 20, 1999 (JP) ............................................. 11-297571

(51) Int. Cl.$^7$ ................................................ H01L 21/44
(52) U.S. Cl. ...................... 438/622; 438/637; 438/652; 257/774; 257/758
(58) Field of Search ................................. 257/774, 758, 257/775; 438/652, 118, 622, 637, 638, 629, 639, 640

(56) References Cited

U.S. PATENT DOCUMENTS 4,920,070 A * 4/1990 Mukai ........................ 437/173

* cited by examiner

Primary Examiner—Roy Potter
(74) Attorney, Agent, or Firm—Ronald P. Kananen, Esq.; Rader, Fishman & Grauer, PLLC

(57) ABSTRACT

A semiconductor device comprising a substrate; a first metal wiring formed in the substrate, wherein the first metal wiring is comprised of a metal; an insulating film formed on the substrate so as to cover the first metal wiring; a trench formed in the insulating film; a via hole formed in the insulating film so as to reach the first metal wiring from the trench; a metal plug for plugging the via hole, wherein the metal plug is comprised of the same metal as that for the first metal wiring and formed so as to directly connect to the first metal wiring and reach the inside of the trench; and a second metal wiring formed in the trench so as to directly connect to the metal plug, wherein the second metal wiring is comprised of the same metal as that for the metal plug. The semiconductor device of the present invention is advantageous not only in that is has an improved electromigration resistance, but also in that it has a wiring structure such that the reliability is high and the resistivity is low.

7 Claims, 3 Drawing Sheets

SEMICONDUCTOR DEVICE A BURRIED WIRING STRUCTURE AND PROCESS FOR FABRICATING THE SAME

BACKGROUND OF THE INVENTION

1. Field of the Invention

The present invention relates to a semiconductor device. More particularly, the present invention is concerned with a semiconductor device having a buried wiring structure which is improved in electromigration resistance. The present invention is also concerned with a process for fabricating the above-mentioned semiconductor device.

2. Prior Art

In semiconductor devices which have been highly integrated, such as ultra large scale integrated-circuits (ULSI), both of higher-speed signal transmission and higher resistance to serious electromigration problem due to the power consumption have been demanded.

Conventionally, as a material for wiring in LSI, an aluminum alloy (e.g., Al-0.5% Cu, Al-1% Si-0.5% Cu, or the like) has been used. In addition, the use of copper having a resistivity lower than that of the aluminum alloy as a material for wiring is effective for further increasing the speed of devices. Copper has a resistivity as low as about 1.8 $\mu\Omega$cm, and is advantageous not only in that it is effective for increasing the speed of the devices, but also in that it has an electromigration resistance higher than that of aluminum by about one figure or more. Therefore, copper is expected as a substitute for the aluminum alloy as a material of wiring.

As a process for fabricating copper wirings, a dual Damascene process has been studied in recent years. This process is one in which a via hole formed in an insulating film and a trench patterned in a wiring form are plugged with copper, and then the excess copper is removed by a chemical mechanical polishing process, thereby fabricating a copper wiring. With respect to the dual Damascene process, various studies have been made on the selection of a material for the insulating film in which a via hole is formed and the selection of a material for the insulating film in which a trench to be plugged with a wiring is formed as well as methods for processing such materials.

On the other hand, from the viewpoint of achieving high reliability of the device, an important task is to obtain a high electromigration resistance, and as mentioned above, it has been reported that copper has an electromigration resistance higher than that of aluminum by about one figure or more.

However, in the electromigration which occurs at a via contact, a change in flow rate of copper atoms occurs in the interface between the copper present on the bottom portion of the via contact and the barrier layer, and in this interface, the barrier layer suppresses the drift of copper, so that copper is not supplied, thus causing a void.

SUMMARY OF THE INVENTION

In this situation, the present inventors have made extensive and intensive studies with a view toward solving the above-mentioned problems accompanying the prior art. As a result, it has unexpectedly been found that a specific semiconductor device is advantageous not only in that is has an improved electromigration resistance, but also in that it has a wiring structure such that the reliability is high and the resistivity is low. Such a specific semiconductor device comprises a substrate; a first metal wiring formed in the substrate, wherein the first metal wiring is comprised of a metal; an insulating film formed on the substrate so as to cover the first metal wiring; a trench formed in the insulating film; a via hole formed in the insulating film so as to reach the first metal wiring from the trench; a metal plug for plugging the via hole, wherein the metal plug is comprised of the same metal as that for the first metal wiring and formed so as to directly connect to the first metal wiring and reach the inside of the trench; and a second metal wiring formed in the trench so as to directly connect to the metal plug, wherein the second metal wiring is comprised of the same metal as that for the metal plug. The present invention is completed, based on the above novel finding.

Accordingly, it is an object of the present invention to provide a semiconductor device which does not suffer the occurrence of voids in the interface between the metal plug and the first metal wiring and the interface between the metal plug and the second metal wiring due to electromigration, and thus has an improved electromigration resistance and a wiring structure such that the reliability is high and the resistivity is low.

It is another object of the present invention to provide an advantageous process for fabricating the above-mentioned excellent semiconductor device.

BRIEF DESCRIPTION OF THE DRAWINGS

The foregoing and other objects, features and advantages of the present invention will be apparent to those skilled in the art from the following description of the presently preferred exemplary embodiments of the invention taken in connection with the accompanying drawings, in which.

DETAILED DESCRIPTION OF THE PREFERRED EMBODIMENTS

Hereinbelow, one preferred embodiment of the semiconductor device according to the present invention will be described in detail with reference to the diagrammatic cross-sectional view of FIG. 1, but the embodiment should not be construed as limiting the scope of the present invention.

Figure 1:
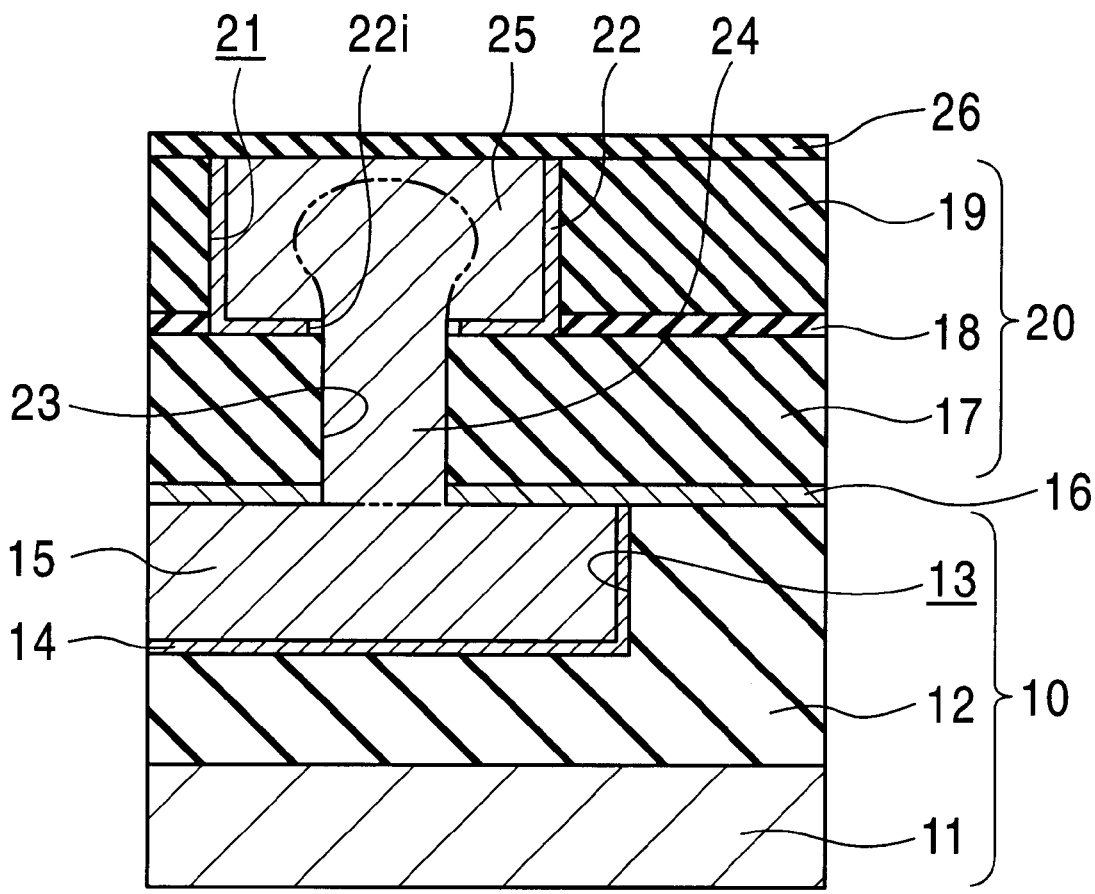
FIG. 1 is a diagrammatic cross-sectional view showing an example of a semiconductor device according to one embodiment of the present invention.

As shown in FIG. 1, a first insulating film 12 is formed on a silicon base material 11 from, for example, a silicon oxide film, thus constituting a substrate 10. A trench 13 is formed in the substrate 10 (first insulating film 12), and a first metal wiring 15 is formed on the inner surface of the trench 13 through a barrier layer 14. The barrier layer 14 is formed from, for example, tantalum nitride, and the first metal wiring 15 is formed from, for example, copper. Further, the surfaces of the first insulating film 12 and the first metal wiring 15 are planarized to be on the same plane.

An anti-oxidizing film 16 is formed on the first insulating film 12 from, for example, a silicon nitride film having a thickness of 100 nm so as to cover the first metal wiring 15. A second insulating film 17 comprised of, for example, a low dielectric-constant organic film having a thickness of 400 nm is formed on the anti-oxidizing film 16. As this low dielectric-constant organic film, for example, an organic polymer generally called polyaryl ether e.g., SILK (trade name), manufactured and sold by Dow Chemical Company, U.S.A.; FLARE (trade name), manufactured and sold by AlliedSignal Inc., U.S.A.; VELOX (trade name), manufactured and sold by Schumacher Co., U.S.A.; or the like}, or fluorocarbon (e.g., a cyclic fluororesin, Teflon®, amorphous Teflon, a fluorinated aryl ether, a fluorinated polyimide or the like) can be used. In this embodiment, as an example, the organic film is formed from SILK., Further, an intermediate insulating film 18 comprised of, for example, a silicon nitride film having a thickness of 100 nm is formed on the second insulating film 17. A third insulating film 19 comprised of, for example, a low dielectric-constant organic film having a thickness of 400 nm is formed on the intermediate insulating film 18. As this low dielectric-constant organic film, the same material as that described above can be used. Thus, an insulating film 20, in which a metal wiring and a plug are formed, is constituted from the second insulating film 17, the intermediate insulating film 18 and the third insulating film 19.

A trench 21 is formed in the insulating film 20 (third insulating film 19 and intermediate insulating film 18). A diffusion-preventing layer 22 for preventing diffusion of a metal (e.g., copper) is formed on the inner surface (sidewall and bottom portion) of the trench 21 from, for example, a tantalum nitride film having a thickness of 50 nm. Further, a via hole 23 is formed in the diffusion-preventing layer 22, the insulating film 20 (second insulating film 17) and the anti-oxidizing film 16 so as to reach the first metal wiring 15.

In addition, the anti-oxidizing film 16 exposed through the sidewall of the via hole 23 is formed on an insulated portion 22i which is electrically insulated by, for example, an oxidization process.

Further, a metal plug 24 for plugging the via hole 23, comprised of the same metal (copper) as that for the first metal wiring 15, is formed in the via hole 23 so as to directly connect to the first metal wiring 15 and reach the inside of the trench 21. A second metal wiring 25 comprised of the same metal (copper) as that for the metal plug 24 is formed in the trench 21 through the diffusion-preventing layer 22 so as to directly connect to the metal plug 24. In addition, an anti-oxidizing film 26 for covering the second metal wiring 25 is formed on the insulating film 20 from, for example, a silicon nitride film having a thickness of 100 nm.

In the above semiconductor device, as the second insulating film 17, a low dielectric-constant organic film is used, but, for example, a silicon oxide film can also be used. This is because in the second insulating film 17 is formed only the via hole 23, and thus, even when the second insulating film 17 is formed from a silicon oxide film, there occurs no increase in capacitance between wirings, which adversely affects the electric properties, such as signal delay and the like.

Further, the diffusion-preventing layer 22 can be formed from not only tantalum nitride but also cobalt phosphorus tungsten, titanium nitride, tungsten nitride, zirconium nitride, hafnium nitride, cobalt, tungsten, silicon nitride, titanium carbide, silicon nitride oxide or the like. Of these, when the diffusion-preventing layer 22 is formed from an insulating film, such as silicon nitride, titanium carbide, silicon nitride oxide or the like, there is no need for electrically insulating the diffusion-preventing layer 22 which is exposed through the sidewall of the via hole 23.

In the above semiconductor device, all of the first metal wiring 15 which constitutes the lower-layer wiring, the second metal wiring 25 which constitutes the upper-layer wiring, and the metal plug 24 which connects the first metal wiring 15 and the second metal wiring 25 are formed from the same metal (copper) so that they ate directly connected to one another without a foreign material therethrough. Therefore, the occurrence of voids in the interface between the metal plug 24 and the first metal wiring 15 and the interface between the metal plug 24 and the second metal wiring 25 due to electromigration is suppressed. In other words, an interface between different materials is not formed, so that the flow rate of copper atoms becomes constant and the electromigration resistance is improved, thus obtaining high reliability in the copper wiring. Further, as mentioned above, no interface between different materials is formed in any of the interfaces between the first metal wiring 15, the metal plug 24 and the second metal wiring 25, and thus, a wiring structure having a low resistivity can be obtained.

Next, one preferred embodiment of the process for fabricating a semiconductor device according to the present invention will be described in detail with reference to the diagrammatic cross-sectional views of FIGS. 2A to 2F and 3A to 3D. In FIG. 1, FIGS. 2A to 2F, and FIGS. 3A to 3D, like parts or portions are indicated by like reference numerals.

Figure 2A:
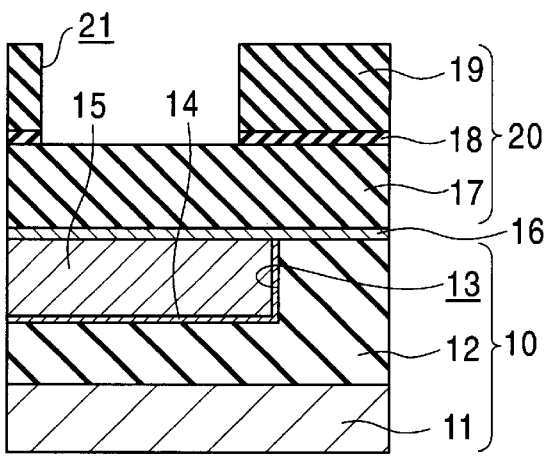
FIGS. 2A to 2F are diagrammatic cross-sectional views showing an example of a process for fabricating a semiconductor device according to one embodiment of the present invention.

As shown in FIG. 2A, a first insulating film 12 is formed on a base material (e.g., silicon base material) 11 from, for example, a silicon oxide film, thus constituting a substrate 10. Then, a first metal wiring is formed by a single Damascene process. Specifically, a trench 13 is formed in the substrate 10 (first insulating film 12) by the general lithography technique and dry etching technique, followed by removal of the resist mask used in the dry etching process. Then, a barrier layer 14 is formed on the inner surface of the trench 13 from, for example, tantalum nitride. Subsequently, copper is deposited so as to plug the trench 13 by a deposition process, such as a sputtering technique, an electroless plating technique or the like, and then, the excess copper and the excess barrier layer 14 on the first insulating film 12 is removed by, for example, a chemical mechanical polishing process, thereby forming a first metal wiring 15 comprised of copper in the trench 13 through the barrier layer 14.

Then, an anti-oxidizing film 16 for covering the first metal wiring 15 is formed on the first insulating film 12 by depositing, for example, silicon nitride so as to have a thickness of 100 nm by, for example, a sputtering process or a chemical vapor deposition (CVD) process in a reducing atmosphere.

In addition, a second insulating film 17 is formed on the anti-oxidizing film 16 by, for example, depositing a low dielectric-constant organic film so as to have a thickness of 400 nm by, for example, an application method. As the low dielectric-constant organic film, for example, an organic polymer generally called polyaryl ether {e.g., SILK (trade name), manufactured and sold by Dow Chemical Company, U.S.A.; FLARE (trade name), manufactured and sold by AlliedSignal Inc., U.S.A.; VELOX (trade name), manufactured and sold by Schumacher Co., U.S.A.; or the like}, or fluorocarbon (e.g., a cyclic fluororesin, Teflon®, amorphous Teflon, a fluorinated aryl ether, a fluorinated polyimide or the like) can be used. In this embodiment, as an example, the organic film is formed from SILK. After the above application, for removing a solvent, baking and curing at 300 to 450° C. are conducted, thereby obtaining a second insulating film 17.

Further, an intermediate insulating film 18 is formed on the second insulating film 17 by, for example, depositing a silicon nitride film so as to have a thickness of 100 nm by, for example, a CVD process. Then, a third insulating film 19 is formed on the intermediate insulating film 18 by, for example, depositing a low dielectric-constant organic film so as to have a thickness of 400 nm. This low dielectric-constant organic film can be formed from the same material as that described above by the same method. Thus, an insulating film 20, in which a metal wiring and a plug are formed, is formed from the second insulating film 17, the intermediate insulating film 18 and the third insulating film 19.

Then, an inorganic mask (not shown), which serves as a mask for etching for forming a trench in the third insulating film 19, is formed on the third insulating film 19 from, for example, silicon nitride, and then, the third insulating film 19 is etched using the mask. Further, the intermediate insulating film 18 is selectively etched. As a result, a trench 21 for forming a metal wiring in the insulating film 20 (third insulating film 19 and intermediate insulating film 18) is formed. The above-mentioned inorganic mask is removed by etching simultaneously with etching the intermediate insulating film 18. In addition, the above inorganic mask can be formed by depositing a silicon nitride film and patterning using the general lithography technique and a dry etching technique.

Figure 2D:
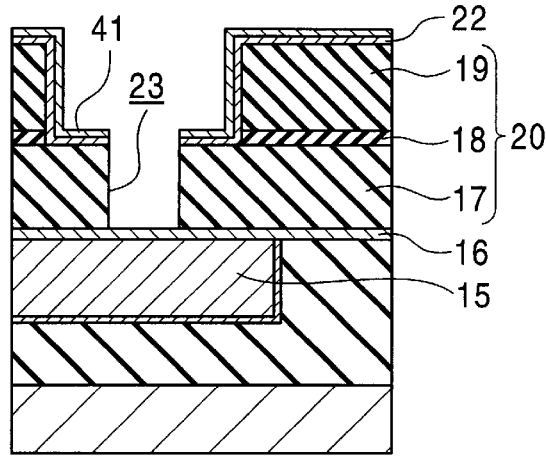
Figure 2B:
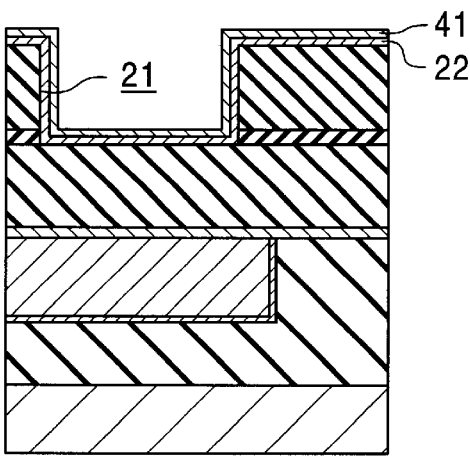

Next, as shown in FIG. 2B, a diffusion-preventing layer 22 for preventing diffusion of a metal (e.g., copper) is formed on the inner surface (sidewall and bottom portion) of the trench 21 by, for example, depositing tantalum nitride so as to have a thickness of 50 nm by, for example, a sputtering process. Further, an insulating film 41, which serves as a mask for the etching process, is formed by, for example, depositing silicon oxide so as to have a thickness of 50 nm by a, CVD process.

Figure 2E:
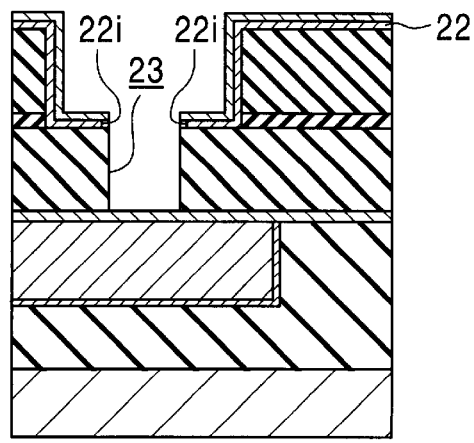
Figure 2C:
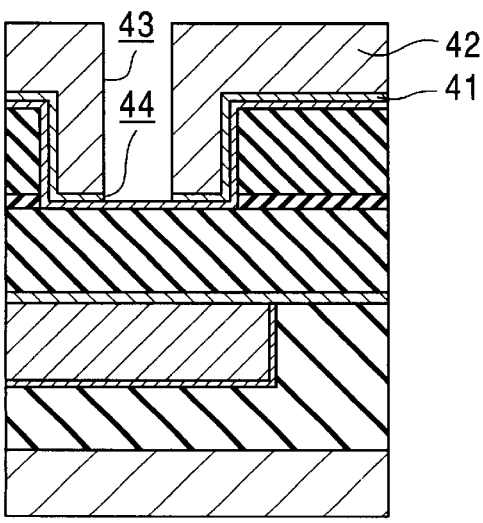

Then, as shown in FIG. 2C, a resist film 42 is formed on the insulating film 41 by the general application technique, and then, an opening portion 43 for opening a via hole is formed by a lithography technique. Subsequently, the insulating film 41 is etched using the resist film 42 as a mask for the etching process, thereby forming an opening portion 44.

Then, as shown in FIG. 2D, a via hole 23 is formed in the diffusion-preventing layer 22 and the insulating film 20 (second insulating film 17) using the resist film 42 (see FIG. 2C) and the insulating film 41. In this stage, the via hole 23 is not yet formed so as to penetrate the anti-oxidizing film 16, and thus, the via hole 23 does not reach the first metal wiring 15. In the etching of the second insulating film 17, the resist film 42 is also removed by the etching process.

Next, as shown in FIG. 2E, the diffusion-preventing layer 22 exposed through the sidewall of the via hole 23 is electrically insulated by an oxidization process, thereby forming an insulated portion 22i. This oxidization process is conducted by, for example, subjecting the layer to exposure to an oxygen plasma atmosphere at about 300° C. for about 1 minute. By the insulated portion 22i formed, no nucleus growth for a plating process occurs from the diffusion-preventing layer 22 during the electroplating process in the subsequent step.

Figure 2F:
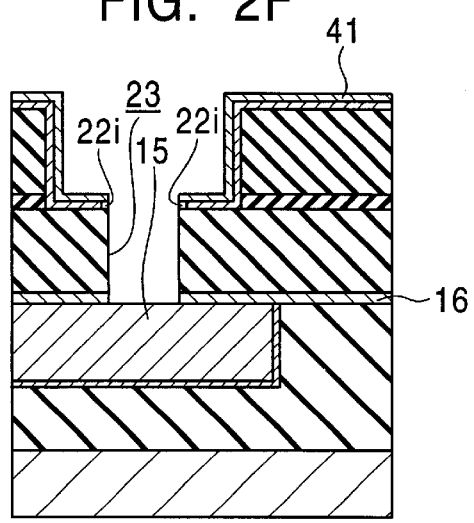

Then, as shown In FIG. 2F, the anti-oxidizing film 16 is etched using the insulating film 41 as a mask for the etching process, thereby allowing the via hole 23 to penetrate the anti-oxidizing film 16 so as to reach the first metal wiring 15.

Figure 3A:
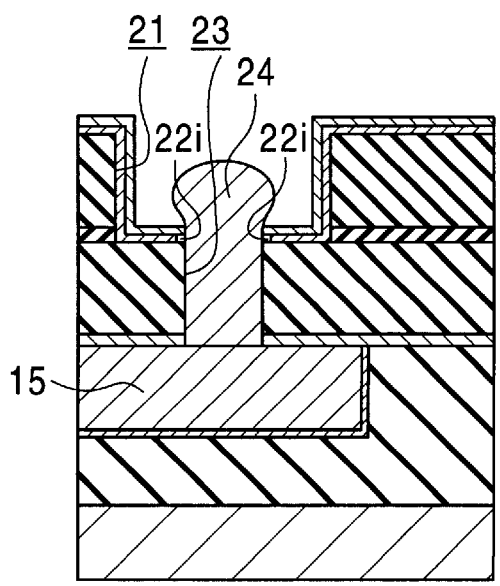
FIGS. 3A to 3D are diagrammatic cross-sectional views (continued from FIG. 2F) showing an example of a process for fabricating a semiconductor device according to one embodiment of the present invention.

Next, as shown in FIG. 3A, copper, which is the same metal as that for the first metal wiring 15, is allowed to grow from the first metal wiring 15 by an electroless plating process so as to plug the via hole 23, and allowed to further grow so as to reach the inside of the trench 21, thereby forming a metal plug 24. Conditions for electroless plating are, for example, such that, as a plating bath, one that contains 7 g/l of $CuSO_4.5H_2O$, 20 ml/l of formalin (37% HCHO), 10 g/l of NaOH, 20 g/l of potassium sodium tartarate, and very small amounts of a stabilizer and a wetting agent is used, and the temperature of the plating bath is 50° C.

Figure 3B:
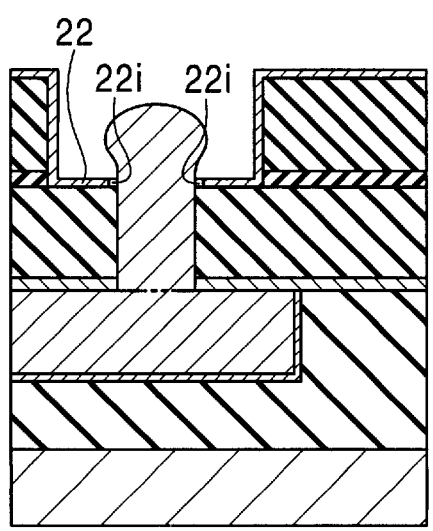

Then, the insulating film 41 is removed by an etching process, and the diffusion-preventing layer 22 is allowed to be exposed as shown in FIG. 3B.

Figure 3C:
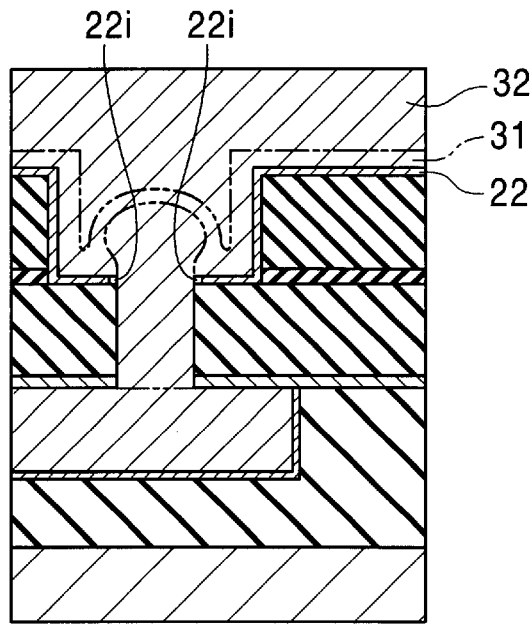

Subsequently, as shown in FIG. 3C, a plating seed layer 31 is formed on the surface of the diffusion-preventing layer 22 by, for example, depositing copper so as to have a thickness of 200 nm by, for example, a sputtering process. Then, a copper film 32 is formed on the plating seed layer 31 by, for example, depositing copper so as to have a thickness of 1.00 μm by an electroplating process. Conditions for the electroplating process are, for example, such that $CUSO_4.5H_2O$ is used in a plating bath, a copper plate is used as an anode, the temperature of the plating bath is 30° C., the applied voltage is 10 V, and the current is 20 A/am².

Figure 3D:
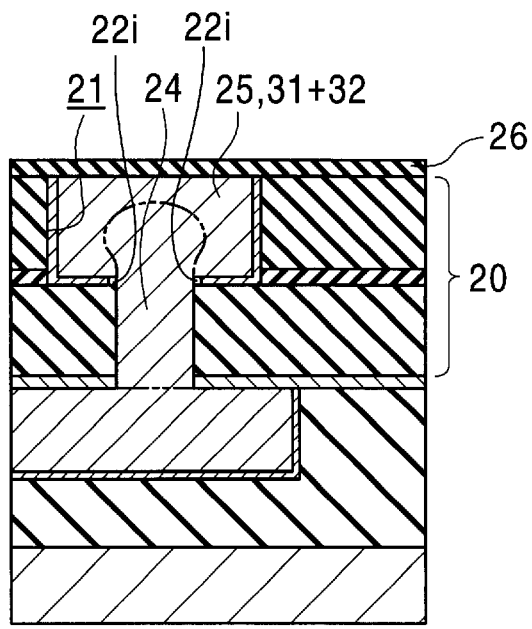

Then, the excess copper film 32, the excess plating seed layer 31 and the excess diffusion-preventing layer 22 on the insulating film 20 are removed by a chemical mechanical polishing process, and, as shown in FIG. 3D, a second metal wiring 25, which is comprised of the same metal (copper) as that for the metal plug 24 and comprises the copper film 32 and the plating seed layer 31, is formed in the trench 21 so as to directly connect to the metal plug 24. Subsequently, an anti-oxidizing layer 26 for covering the second metal wiring 25 is formed on the insulating film 20 by, for example, depositing a silicon nitride film to as to have a thickness of 100 nm.

In the above fabrication process, as the second insulating film 17, a low dielectric-constant organic film is used, but, for example, a silicon oxide film can also be used. This is because in the second insulating film 17 is formed only the via hole 23, and thus, even when the second insulating film 17 is formed from a silicon oxide film, there occurs no increase in capacitance between wirings, which adversely affects the electric properties, such as signal delay and the like.

Further, the diffusion-preventing layer 22 can be formed from not only tantalum nitride but also cobalt phosphorus tungsten, titanium nitride, tungsten nitride, zirconium nitride, hafnium nitride, cobalt, tungsten, silicon nitride, titanium carbide, silicon nitride oxide or the like. Of these, when the diffusion-preventing layer 22 is formed from an insulating film, such as silicon nitride, titanium carbide, silicon nitride oxide or the like, there is no need for electrically insulating the diffusion-preventing layer 22 which is exposed through the sidewall of the via hole 23.

In the above process for fabricating a semiconductor device, all of the first metal wiring 15 which constitutes the lower-layer wiring, the second metal wiring 25 which constitutes the upper-layer wiring, and the metal plug 24 which connects the first metal wiring 15 and the second metal wiring 25 are formed from the same metal (copper) so that they are directly connected to one another without a foreign material therethrough. Such a structure is equivalent to one in which the first metal wiring 15, the metal plug 24 and the second metal wiring 25 are integrally formed from the same metal (copper). Therefore, the occurrence of voids in the interface between the metal plug 24 and the first metal wiring 15 and the interface between the metal plug 24 and the second metal wiring 25 due to electromigration is suppressed. In other words, no interface between different materials is formed in any of the interfaces between the first metal wiring 15, the metal plug 24 and the second metal wiring 25, so that the flow rate of copper atoms becomes constant and the electromigration resistance is improved. Therefore, a copper wiring structure having high reliability can be obtained. Further, as mentioned above, no interface between different materials is formed in any of the interfaces between the first metal wiring 15, the metal plug 24 and the second metal wiring 25, and the metal plug 24 is formed by electroless plating, so that relatively large crystals grow, thus obtaining a wiring structure having a low resistivity.

The semiconductor device of the present invention is advantageous in that, since all of the first metal wiring which constitutes the lower-layer wiring, the second metal wiring which constitutes the upper-layer wiring, and the metal plug which connects the first metal wiring and the second metal wiring are formed from the same metal so that they are directly connected to one another, and there is therefore no interface between different materials, the occurrence of voids in the interface between the metal plug and the first metal wiring and the interface between the metal plug and the second metal wiring due to electromigration can be prevented, so that the electromigration resistance can be improved, thus obtaining a wiring structure having high reliability and a low resistivity.

Further, by the process of the present invention, the above-mentioned excellent semiconductor device can be obtained.

What is claimed is:

1. A semiconductor device comprising:

a substrate;

a first metal wiring formed in said substrate, said first metal wiring being comprised of a metal;

an insulating film formed on said substrate so as to cover said first metal wiring;

a trench formed in said insulating film;

a via hole formed in said insulating film so as to reach said first metal wiring from said trench;

a metal plug for plugging said via hole, said metal plug being comprised of the same metal as that for said first metal wiring and formed so as to directly connect to said first metal wiring and reach the inside of said trench; and a second metal wiring formed in said trench so as to directly connect to said metal plug, said second metal wiring being comprised of the same metal as that for said metal plug, and further comprising a diffusion-preventing layer for preventing diffusion of said metal, wherein said diffusion-preventing layer is formed on each of the sidewall and the bottom portion of said trench.

2. The semiconductor device according to claim 1, wherein at least a portion of said diffusion-preventing layer exposed through the sidewall of said via hole is electrically insulated.

3. A semiconductor device comprising:

a substrate;

a first metal wiring formed in said substrate, said first metal wiring being comprised of a metal;

an insulating film formed on said substrate so as to cover said first metal wiring; a trench formed in said insulating film;

a via hole formed in said insulating film so as to reach said first metal wiring from said trench;

a metal plug for plugging said via hole, said metal plug being comprised of the same metal as that for said first metal wiring and formed so as to directly connect to said first metal wiring and reach the inside of said trench; and a second metal wiring formed in said trench so as to directly connect to said metal plug, said second metal wiring being comprised of the same metal as that for said metal plug, wherein said metal for said first metal wiring is copper.

4. A process for fabricating a semiconductor device, which comprises the steps of:

forming, in a substrate, a first metal wiring comprised of a metal;

forming an insulating film on said substrate so as to cover said first metal wiring;

forming a trench in said insulating film;

forming a via hole in said insulating film so as to reach said first metal wiring from said trench;

forming a metal plug so as to plug said via hole and reach the inside of said trench by allowing the same metal as that for said first metal wiring to grow on said first metal wiring; and forming, in said trench, a second metal wiring comprised of the same metal as that for said metal plug so as to directly connect to said metal plug, and further comprising the step of, after forming said trench and before forming said via hole, forming a diffusion-preventing layer for preventing diffusion of said metal on each of the sidewall and the bottom portion of said trench.

5. The process according to claim 4, which further comprises the step of, before allowing said via hole to penetrate, electrically insulating said diffusion-preventing layer exposed through the sidewall of said via hole.

6. The process according to claim 5, wherein said step of electrically insulating said diffusion-preventing layer-is achieved by oxidizing the portion of said diffusion-preventing layer exposed though the sidewall of said trench.

7. The process according to claim 4, wherein said metal for said first metal wiring is copper.

* * * * *

UNITED STATES PATENT AND TRADEMARK OFFICE
CERTIFICATE OF CORRECTION

PATENT NO. : 6,395,627 B1
DATED : May 28, 2002
INVENTOR(S) : Kazuhiro Hoshino

It is certified that error appears in the above-identified patent and that said Letters Patent is hereby corrected as shown below:

<u>Column 8,</u>
Line 51, replace "layer-is" with -- layer is --.

Signed and Sealed this

Thirty-first Day of December, 2002

JAMES E. ROGAN
*Director of the United States Patent and Trademark Office*